United States Patent
Fujiwara et al.

[11] Patent Number: 5,436,626
[45] Date of Patent: Jul. 25, 1995

[54] VARIABLE-LENGTH CODEWORD ENCODER

[75] Inventors: Hiroshi Fujiwara; Toshifumi Sakaguchi; Akio Shimatzu, all of Tokyo, Japan; Ming-Ting Sun, Holmdel, N.J.; Kou-Hu Tzou, Marlboro, N.J.; Kun-Min Yang, Somerville, N.J.

[73] Assignees: Bell Communications Research, Inc., Livingston, N.J.; Graphics Communication Technologies, Ltd., Tokyo, Japan

[21] Appl. No.: 906,269

[22] Filed: Jun. 26, 1992

Related U.S. Application Data

[63] Continuation of Ser. No. 672,387, Mar. 20, 1991, abandoned.

[30] Foreign Application Priority Data

Mar. 26, 1990 [JP] Japan ................................. 2-73493

[51] Int. Cl.⁶ ............................................. H03M 7/40
[52] U.S. Cl. ............................................. 341/67; 341/63
[58] Field of Search ........................ 341/60, 63, 64, 65, 341/67

[56] References Cited

U.S. PATENT DOCUMENTS

| | | | |
|---|---|---|---|
| 3,675,211 | 7/1972 | Raviv | 341/67 |
| 4,593,267 | 6/1986 | Kuroda et al. | 341/67 |
| 4,914,675 | 4/1990 | Fedele | 341/67 X |
| 4,963,867 | 10/1990 | Bertrand | 341/60 |
| 5,062,125 | 10/1991 | Langlais et al. | 341/67 X |
| 5,079,548 | 1/1992 | Fujiyama et al. | 341/67 |
| 5,140,322 | 8/1992 | Sakagami | 341/65 |
| 5,146,220 | 9/1992 | Ishikawa | 341/67 |
| 5,162,795 | 12/1992 | Shirota | 341/67 |

*Primary Examiner*—Howard L. Williams
*Attorney, Agent, or Firm*—Leonard Charles Suchyta; Stephen M. Gurey

[57] ABSTRACT

A variable-length codeword encoder is disclosed which produces 8-bit output segments for storage in a buffer (23) for subsequent transmission over a transmission channel (24). The encoder includes two memory tables (15, 16), which produce in response to each input symbol to be encoded, a variable-length codeword and an a codeword length. An accumulator (31, 33) accumulates, modulo-8, the successive codeword lengths, producing a carry signal during any clock cycle in which eight or more bits codeword bits are accumulated. At each clock cycle, the variable-length codeword is input to the parallel inputs of a cross bar shift control circuit (30). This shift control circuit produces a 16-bit output in which the input word is embedded. The input word is shifted in the 16-bit output from the more significant bit positions to the less significant positions by a shift value determined from previous accumulated codeword lengths, with the shift value number of "0" bits being inserted in the more significant bit positions preceding the codeword. An OR circuit (38) combines the shifted variable-length codeword with previous variable-length codeword bits to form a concatenated sequence which is stored in upper and lower latches (53, 54). At any clock cycle, when the number of accumulated codeword bits is less than eight, the concatenated bits stored in the first and second latches are fed back to the OR circuit for combination at the next clock cycle with the next shifted variable-length codeword. When eight or more codeword bits are accumulated, the accumulator produces a carry signal and the 8-bit segment in the upper latch is outputted. The 8-bits in the lower latch are then shifted to the more significant bit positions of a concatenated sequence that is fed back to the OR circuit for combination with the next shifted variable-length codeword.

1 Claim, 5 Drawing Sheets

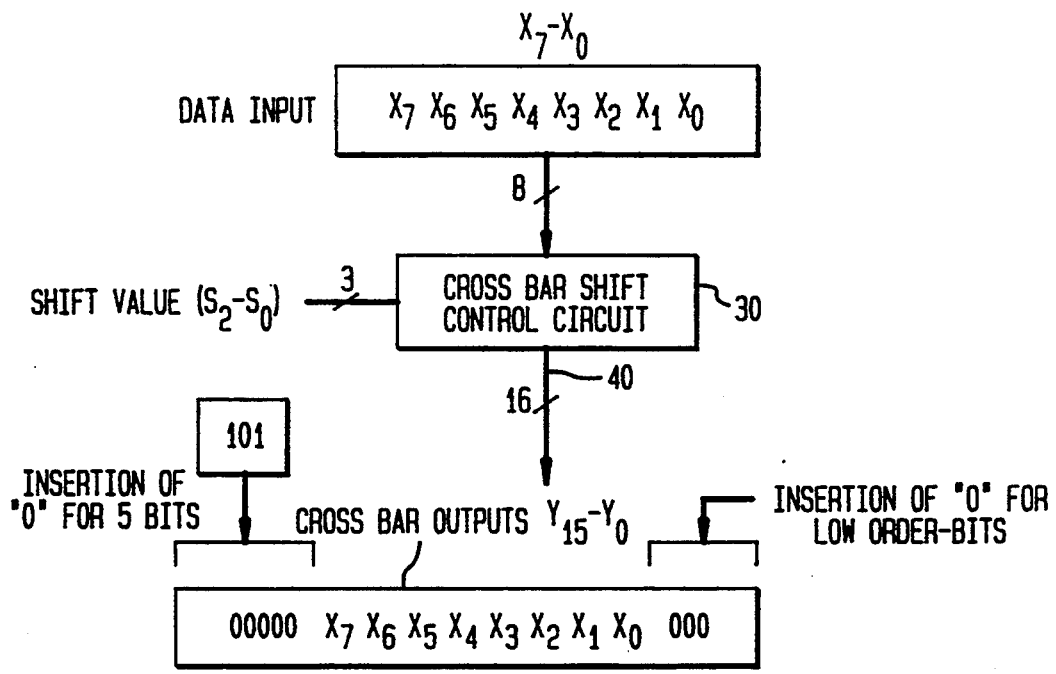

FIG. 5A

| CLOCK | VARIABLE-LENGTH CODEWORD 17 | CODEWORD LENGTH 18 | ADDER LATCH 33 (SHIFT) | CARRY LATCH 36 | UPPER LATCH 53 | LOWER LATCH 54 | OUTPUT REGISTER 57 | ADDER OUTPUT 31 | CARRY 35 |
|---|---|---|---|---|---|---|---|---|---|
| 1 | $a_1a_2a_300000$ | 3 | 0 | 0 | 00000000 | 00000000 | X | 3 | 0 |
| 2 | $b_1b_2b_3b_40000$ | 4 | 3 | 0 | $a_1a_2a_300000$ | 00000000 | X | 7 | 0 |
| 3 | $c_1c_2c_3c_4c_5c_600$ | 6 | 7 | 0 | $a_1a_2a_3b_1b_2b_3b_40$ | 00000000 | X | 5 | 1 |
| 4 | $d_1d_2d_300000$ | 3 | 5 | 1 | $a_1a_2a_3\ b_1b_2b_3b_4c_1$ | $c_2c_3c_4c_5c_6000$ | X | 0 | 1 |
| 5 | $e_1e_2e_3e_40000$ | 4 | 0 | 1 | $c_2c_3c_4c_5c_6d_1d_2d_3$ | 00000000 | $a_1a_2a_3b_1b_2b_3b_4c_1$ | 4 | 0 |
| 6 | $f_1f_2000000$ | 2 | 4 | 0 | $e_1e_2e_3e_40000$ | 00000000 | $c_2c_3c_4c_5c_6d_1d_2d_3$ | 6 | 0 |
| 7 | $g_1g_2g_3$ | 3 | 6 | 0 | $e_1e_2e_3e_4f_1f_200$ | 00000000 | -- | 1 | 1 |
| 8 | $h_1h_2h_300000$ | 3 | 1 | 1 | $e_1e_2e_3e_4\ f_1f_2g_1g_2$ | $g_30000000$ | -- | 4 | 0 |
| 9 | $i_1i_200000$ | 2 | 4 | 1 | $g_3h_1h_2h_30000$ | 00000000 | $e_1e_2e_3e_4f_1f_2g_1g_2$ | 6 | 0 |

FIG. 5B

| CLOCK | CROSS-BAR OUTPUT 40 | DATA SELECTOR OUTPUT 41 | DATA SELECTOR OUTPUT 42 | OR OUTPUT 51 & 52 |
|---|---|---|---|---|
| 1 | $a_1a_2a_3$0000000000000 | 00000000 | 00000000 | $a_1a_2a_3$0000000000000 |
| 2 | 000$b_1b_2b_3b_4$000000000 | $a_1a_2a_3$00000 | 00000000 | $a_1a_2a_3b_1b_2b_3b_4$000000000 |
| 3 | 0000000$c_1c_2c_3c_4c_5c_6$000 | $a_1a_2a_3b_1b_2b_3b_4$0 | 00000000 | $a_1a_2a_3b_1b_2b_3b_4c_1c_2c_3c_4c_5c_6$000 |
| 4 | 00000$d_1d_2d_3$00000000000 | $c_2c_3c_4c_5c_6$000 | 00000000 | $c_2c_3c_4c_5c_6d_1d_2d_3$00000000 |
| 5 | $e_1e_2e_3e_4$000000000000 | 00000000 | 00000000 | $e_1e_2e_3e_4$000000000000 |
| 6 | 0000$f_1f_2$0000000000000 | $e_1e_2e_3e_4$0000 | 00000000 | $e_1e_2e_3e_4f_1f_2$0000000000 |
| 7 | 000000$g_1g_2g_3$0000000 | $e_1e_2e_3e_4f_1f_2$0 0 | 00000000 | $e_1e_2e_3e_4f_1f_2g_1g_2g_3$0000000 |
| 8 | 0$h_1h_2h_3$00000000000000 | $g_3$0000000 | 00000000 | $g_1h_1h_2h_3$00000000000000 |
| 9 | 0000$i_1i_2$0000000000000 | $g_3h_1h_2h_3$0000 | 00000000 | $g_3h_1h_2h_3i_1i_2$0000000000 |

FIG. 5C

| FIG. 5A | FIG. 5B |
|---|---|

VARIABLE-LENGTH CODEWORD ENCODER

CROSS-REFERENCE TO RELATED APPLICATION

This is a continuation-in part of Ser. No. 672,387, filed Mar. 20, 1991 now abandoned.

BACKGROUND OF THE INVENTION

This invention relates to an entropy encoder for use in a high speed data transmission system, and more particularly to a variable-length codeword encoder.

Variable-length coding is a coding technique often used for lossless data compression. In accordance with this technique, fixed-length data is converted into variable-length codewords according to the statistics of the data. In general, the lengths of the codewords are chosen so that shorter codewords are used to represent the more frequently occurring data and longer codewords are chosen to represent the less frequently occurring data. By properly assigning the variable-length codewords to the library of all possible source codewords, the average word length of the variable-length code is shorter than that of the original data and, therefore, data compression is achieved. Huffman code design is a procedure commonly used to construct a minimum redundant variable-length code for a known data statistic. Generally, the encoding process can be implemented by a table-lookup process using the input data to address the table. The codewords and word-lengths are stored as table contents. Each fixed-length input symbol word is coded, at a sample clock rate, into the variable-length codeword it is associated with in the table, and the associated table codeword lengths are used to control circuitry to bit-by-bit concatenate the successive variable-length codewords into a bit stream. The bit stream is then divided into fixed-length data segments and stored in a buffer and then outputted sequentially at either a fixed or a variable rate for transmission over a data channel. At the receiving end, a buffer generally stores the received bit stream in fixed-length segments and retrieves these segments to form a continuous stream from which each variable-length codeword is successively decoded, at the fixed sample clock rate, back into its original source symbol.

Both the encoding and decoding of variable-length codewords are difficult at high speeds. Generally, during each symbol period in both the encoder and decoder all the bits in a variable-length codeword may need to be shifted through a register at a rate substantially greater than the sample clock rate. Speed requirements are a particular critical concern in the digital transmission of high definition (HDTV) signals. In such an HDTV system the total sample rate (combining luminance and chrominance signals) is likely to be 100 MHz. If variable-length coding is used, the maximum length codeword could typically be 16 bits. In the worst case, therefore, an encoder or decoder would need to shift bits through a register at 16 times the sample rate, or at 1.6 G bits/sec, to code or decode words at the sample rate. Such high speeds are very difficult to implement using current IC technology.

The problem of high-speed decoding in a variable-length decoder is approached in co-pending patent application, Ser. No. 546,415, filed Jun. 29, 1990, co-invented by two of the co-inventors herein. That decoder includes two cascaded latch circuits, each having a bit capacity equal to the maximum codeword length and which store consecutive bits supplied from an input buffer memory which stores the stream to be decoded in fixed-length data segments; a barrel shifter, which is input from the two latch circuits and which provides a sliding decoding window output equal in length to the maximum codeword length; an accumulator which accumulates, modulo the maximum codeword length, the lengths of the sequentially decoded variable-length codewords; and a table-lookup memory device, which outputs, for an input sequence of bits that begins with the first bit of a variable-length codeword, a fixed-length word corresponding to that variable-length codeword and that variable-length codeword length. As a codeword is decoded during each clock cycle, its length is accumulated and the decoding window of the barrel shifter is directly shifted to begin with the first bit of the next to-be-decoded codeword. When, during a clock cycle, the accumulated lengths exceeds the maximum codeword length, which indicates that all the bits in the first latch circuit have been decoded, the bits in the second latch are transferred into the first latch and the next fixed-length data-segment of bits is read into the second latch from the buffer memory. With this decoder, a continuous stream of bits from the buffer is always at-the-ready to be decoded and the variable-length codewords can be decoded at the sample clock rate without the necessity of clocking bits at a very high bit rate.

As aforenoted, at the transmitting end of a high-speed data transmission system, a similar problem needs to be solved in order to code each symbol at the sample clock rate without needing to shift bits at a higher rate. Although at a high level of understanding, the problem of coding and decoding are conceptually related, in actuality the problems associated with the coding and decoding of variable-length codewords are dissimilar. Whereas the problem in the decoder is to determine, from an already existing continuous stream of variable-length words, the end of each successive word and then shift to the next word in a single clock cycle, the encoder oppositely must form the continuous stream from successive words that arrive a constant rate but with a variable number of bits. Thus, the encoder must concatenate each successive word with a previous one in a single clock cycle. Furthermore, the concatenated stream needs to be divided into fixed-length segments to be stored in a buffer for later accessing for transmission over the data channel at either a fixed or variable bit rate.

An object of the present invention is to code input symbols into variable-length codewords at a sample clock rate, to concatenate, at each clock cycle, the resultant variable-length codewords into a stream, and to output to a buffer fixed-length segments of the concatenated stream as that fixed number of bits are accumulated.

SUMMARY OF THE INVENTION

The variable-length encoder of the present invention includes a memory device for producing, in response to each symbol to be encoded, a variable-length codeword and a codeword length that indicates the length of each codeword. At each clock cycle, the variable-length codeword is concatenated in a bit stream with previously concatenated variable-length codeword bits. When a predetermined number of bits have been accumulated in the stream, a segment of that predetermined number of bits are output. The encoder includes an accumulator which accumulates, modulo-(the predetermined number of bits in the segment), the lengths of successive variable-length codewords being encoded. At each clock cycle a variable-length codeword, having a predetermined maximum codeword length, is input to a shift control circuit, which outputs its input codeword in an output window having a bit-width equal to the sum of the maximum codeword length and the predetermined number of bits in the segment. The input codeword is shifted in the output window from the most significant bit position in the window by a shift value determined from the accumulated previous codeword lengths. The shifted input codeword at the output of the shift control circuit is combined with accumulated previous variable-length codeword bits to form a new concatenated stream of bits which are stored, in two consecutive portions, in first and second storage devices which hold the predetermined segment length number of bits and the maximum codeword length number of bits, respectively. At the next clock cycle, this stream of bits in the first and second storage devices is concatenated with the next shifted variable-length codeword to form the new stream, which is then stored. The cycle continues until the accumulator indicates that the predetermined segment number of bits has been accumulated. At that time, those bits in the first storage device are outputted, and the bits in the second storage device are shifted to the more significant bit positions in the stream. At the next clock cycle, the remaining bits in the stream are concatenated with the next shifted variable-length codeword to form a new stream which is then stored in the first and second storage devices. The shift-concatenate-store cycle is repeated until the predetermined segment number of bits are again accumulated. As before, those segment bits are outputted and the remaining bits shifted to the more significant bit positions in the stream.

BRIEF DESCRIPTION OF THE DRAWING

FIG. 3 illustrates the operation of the cross bar shift control circuit within the data generation circuit of FIG. 2;

FIG. 4 is a table showing the output of the cross bar shift control circuit for each possible input shift value; and FIGS. 5A and 5B, when placed side-by-side as shown in FIG. 5C, illustrate an example of the operation of the data generation circuit in FIG. 2 through several clock cycles.

DETAILED DESCRIPTION

Figure 1:
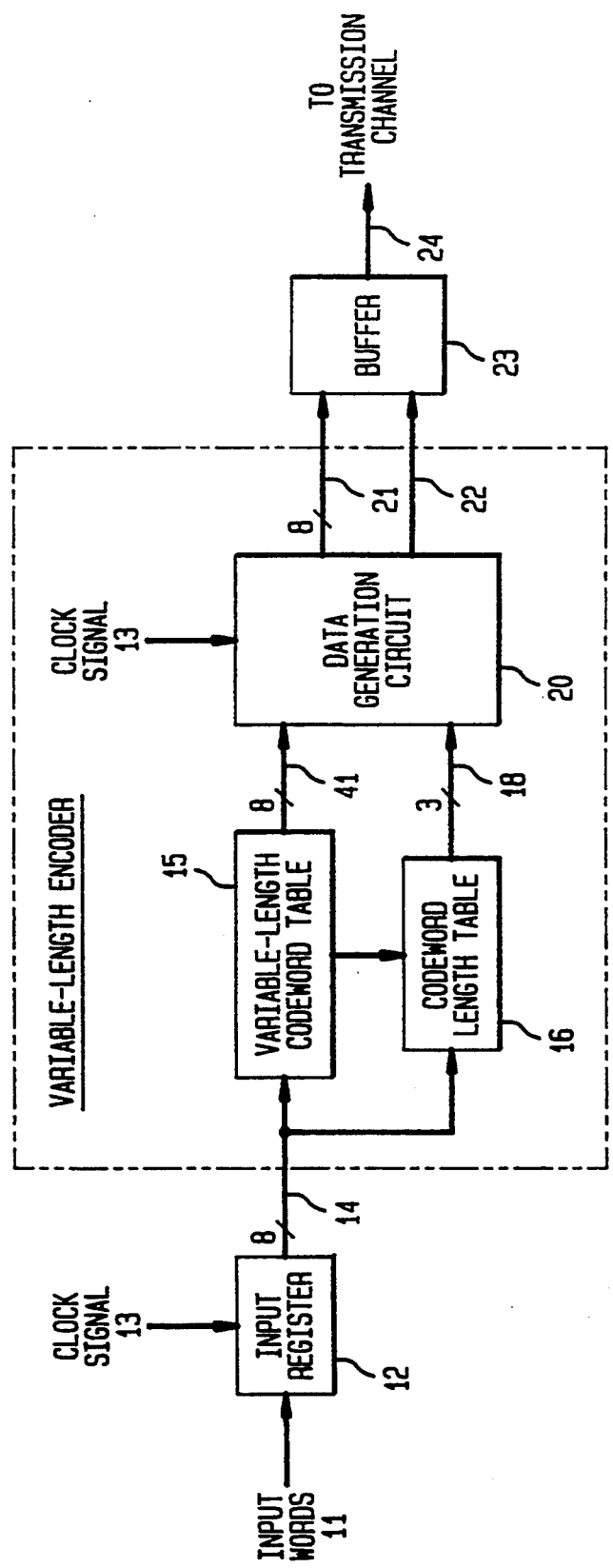
FIG. 1 is a block diagram of a variable-length encoder of the present invention which encodes input words into variable-length words, concatenates successive variable-length codewords, and stores fixed-length segments of the concatenated variable-length words in a buffer for transmission over a channel.

With reference to FIG. 1, input symbols in a fixed-length word format are input over lead 11 to an input register 12 in response to a clock signal 13 at the sample clock rate. In the example to be described herein it will be assumed for purposes of illustration that each fixed-length word consists of 8-bits, and is to be coded into a variable-length codeword that ranges between 2- and 8-bits long. The variable-length codeword library is formulated depending upon the a priori data statistics for each input symbol so that the more likely symbols are assigned to the shorter variable-length codewords and the less likely input symbols are assigned to the longer variable-length codewords. In an actual system a variable-length codeword would more likely be between 2- and 16-bits long. In order, however, to simplify the discussion that follows and the example of FIGS. 5A and 5B, the maximum length of each variable-length word has been limited to 8-bits.

Input register 12 outputs on parallel leads 14, at the clock rate, successive fixed-length input words to be encoded. Each successive fixed-length input word is simultaneously applied to a variable-length codeword table 15 and a codeword length table 16. Tables 15 and 16 are table-lookup memory devices which have stored, for each possible fixed-length input codeword, the associated variable-length codeword and the associated variable-length codeword length, respectively. The output of variable-length codeword table 15 is thus a variable-length word having between 2- and 8-bits. Since a table-lookup memory device can only produce a fixed-length output, the output of table 15 on the eight parallel leads 17 consists of the codeword bits (between 2- and 8-bits) in the upper more significant bit locations, followed a necessary number of "0" filler bits in the lower less significant non-codeword bit positions. The output of codeword length table 16, on parallel leads 18, indicates, in binary fashion, the length of each variable-length codeword being output by table 15 on leads 17. Since the length of each variable-length codeword is between 2-and 8-bits, the output of codeword length table 16 is represented on three parallel output leads 18. Although shown in FIG. 1 as two separate memory devices, tables 15 and 16 could be combined in a single device, such as a programmable logic array, having an input plane and two output planes, and which produces two separate outputs for each input codeword.

The variable-length codeword output of table 15 and the codeword length output of table 16 are input to data generation circuit 20. As will be described in detail hereinafter, data generation circuit 20 concatenates, at the clock rate of the clock signal 13, the significant non-filler codeword bits of the current variable-length codeword on leads 17 with the bits from previous word or words. When 8-bits worth of concatenated codeword bits have been accumulated, data generation circuit 20 outputs these 8-bits on parallel leads 21 and, in response to a signal on lead 22, inputs this 8-bit data segment into buffer 23. The successively stored 8-bit data segments are output in a time-ordered fashion onto transmission channel 24 at either a fixed-rate or a variable-rate, depending upon the particular transmission system requirements. In the particular embodiment being described, each output segment has been assumed to be 8-bits. In an actual system each output segment can be any length greater than or equal to the maximum-length variable-length codeword.

Data generation circuit 20 will be described with reference to FIG. 2. Similar numerical designations have been given to corresponding elements in FIGS. 1 and 2. Each variable-length codeword output by table 15 on leads 17, at the clock rate, is input to cross bar shift control circuit 30, and each corresponding codeword length output by table 16 on leads 18 is input to adder 31. The output of adder 31, on parallel leads 32, is input to an adder latch 33, the output of which, on parallel leads 34, forms a second input to adder 31. Adder 31 in cooperation with adder latch 33, forms an accumulator which accumulates, modulo-8, the codeword lengths of successive codewords. Specifically, at each clock tick of clock signal 13, the sum of the previous accumulated codeword lengths on leads 34, and the current codeword length on leads 18, is entered into latch 33. Adder 31 generates a "carry" signal on lead 35 at any clock tick at which the sum of the current codeword length plus the previously accumulated codeword lengths is equal to or greater than eight. The carry signal is input to a carry latch 36. At the clock tick following a carry signal of "1", carry latch produces a carry latch signal of "1" on lead 37. As will be described, this carry latch signal, which is "1" when more than eight codeword bits have been accumulated, initiates the output of an 8-bit segment of concatenated codeword bits.

The concatenated codeword bit stream is produced by the cooperation of cross bar shift control circuit 30, and OR circuit 38. Cross bar shift control circuit 30 is controlled by a 3-bit shift value, consisting of bits $S_2-S_0$ on output leads 34 of adder latch 33. Cross bar shift control circuit 30 is best described with reference to FIGS. 3 and 4. Cross bar shift control circuit 30 has an 8-bit input window on leads 17, and a 16-bit output window on leads 40. The variable-length codeword input on leads 17 consists of 8-bits, $X_7-X_0$. Depending upon the codeword length, between zero and six of the less significant bits of this input sequence are "0"s. In response to the shift value, $S_2-S_0$, on leads 34, cross bar shift control circuit shifts its input sequence within the 16-bit output window consisting of $Y_{15}-Y_0$. Thus, for a shift value of five, or "101", the input bits $X_7-X_0$, are shifted 5-bits. As noted in FIG. 7, therefore, five "0" bits are inserted before $X_7-X_0$, and three "0" bits are inserted as low-order bits. FIG. 8 shows the eight output sequences for the eight possible shift values, S0–S7.

The 16-bit output 40 of cross bar shift control circuit 30 is input to OR circuit 38, together with the combined 8-bit output of data selector 41 and the 8-bit output of data selector 42 on the 16 parallel leads 45. As will be described, the 8-bit output of data selector 41 contains up to 7-bits of previous concatenated variable-length codeword bits and the 8-bit output of data selector 42 is always all "0"s. At noted hereinabove, and as will be more evident in the operational example that will be described later, the shift value input to cross bar shift control circuit 30 is equal to that number of accumulated bits. The output of cross bar shift control circuit 30 is thus shifted so that same number of "0" bits are inserted before the current variable-length codeword on leads 17. OR circuit 38 is thus able to concatenate the current variable-length codeword with the previous concatenated variable-length bits that have not yet been output as an 8-bit segment, to form a 16-bit sequence of concatenated bits. This 16-bit sequence includes up to 7-bits of previous codeword bits and up to the 8-bit longest-length variable-length word of the current codeword. The significant number of codeword bits in this sequence is thus equal to the sum of previous accumulated modulo-8 codeword lengths plus the codeword length of the current codeword.

The 16-bit sequence at the output of OR circuit 38 consists of eight upper more significant bit outputs on leads 51, and eight lower less significant bit outputs on leads 52. At the clock tick that follows the OR combination, the upper 8-bits are stored in upper latch 53 and the lower 8-bits are stored in lower latch 54. The upper latch 53 is connected to one set of inputs of data selector 41 and the lower latch is connected to a second set of inputs of data selector 41 as well as a first set of inputs of data selector 42. Eight parallel "0"s are connected via leads 55 as a second set of inputs to data selector 42.

Data selectors 41 and 42 are controlled by the carry latch signal on lead 37. When the carry latch is "0", which indicates that fewer than eight previous variable-length codeword bits have been accumulated, data selectors 41 and 42 select their first inputs as outputs. The 16-bits on leads 45 from the combined outputs of data selectors 41 and 42 thus form the input to OR circuit for concatenation with the next variable-length codeword, the latter being shifted by cross bar shift control circuit 30 by that same accumulated number of bits. When carry latch is "1", however, indicating that at least 8-bits have been accumulated, data selectors 41 and 42 select their second inputs as outputs. In this latter case, therefore, the contents of the lower latch are transferred into the most significant bit positions of the 16-bit input to OR circuit 38 and the eight least significant bit positions are set to "0". Since the accumulator is counting modulo-8, the shift value input to cross bar shift control circuit 30 is automatically set to shift the next input variable-length codeword by the number of codeword bits still remaining in the combined outputs of data selectors 41 and 42. The operation of these circuits thus always cooperate to ensure that each successive variable-length codeword on leads 17 is concatenated with the previous concatenated codeword bits.

Each time 8-bits are accumulated, the resultant 8-bit segment of concatenated variable-length codeword bits are ready to be stored in the buffer. Upper latch 53 is thus also connected via leads 56 to output register 57. Output register 57 is controlled by carry latch signal on lead 37. When the carry latch signal is "1" output register 57 stores the current 8-bits in upper latch 53. Thus, at the clock tick following an accumulation of 8-bits, eight of the concatenated bits then in upper latch 53 form a new segment and the remaining bits then in the lower latch 54 become the more significant bits for the next successive concatenation.

Output register 57 stores the most recent segment of concatenated variable-length codewords bits until the clock tick that follows a carry latch signal of "1", when it is updated with the next 8-bit segment. Output register 57 is connected to the buffer 23 via leads 21. Input of each successive 8-bit segment to buffer 23 is controlled by buffer latch 58 via lead 22. Only when the buffer latch 58 is "1", is the current segment in output register 57 input to the buffer 23. Buffer latch 58 is connected to carry latch 36 and to the clock signal 13. Buffer latch 58 is thus "1" at the clock tick that follows a carry latch of "1". Only at that time, therefore, is the segment in output register 57 stored in the buffer 23. An 8-bit segment is thus input to the buffer 23 only for each new 8-bit segment of concatenated codeword bits.

Figure 2:
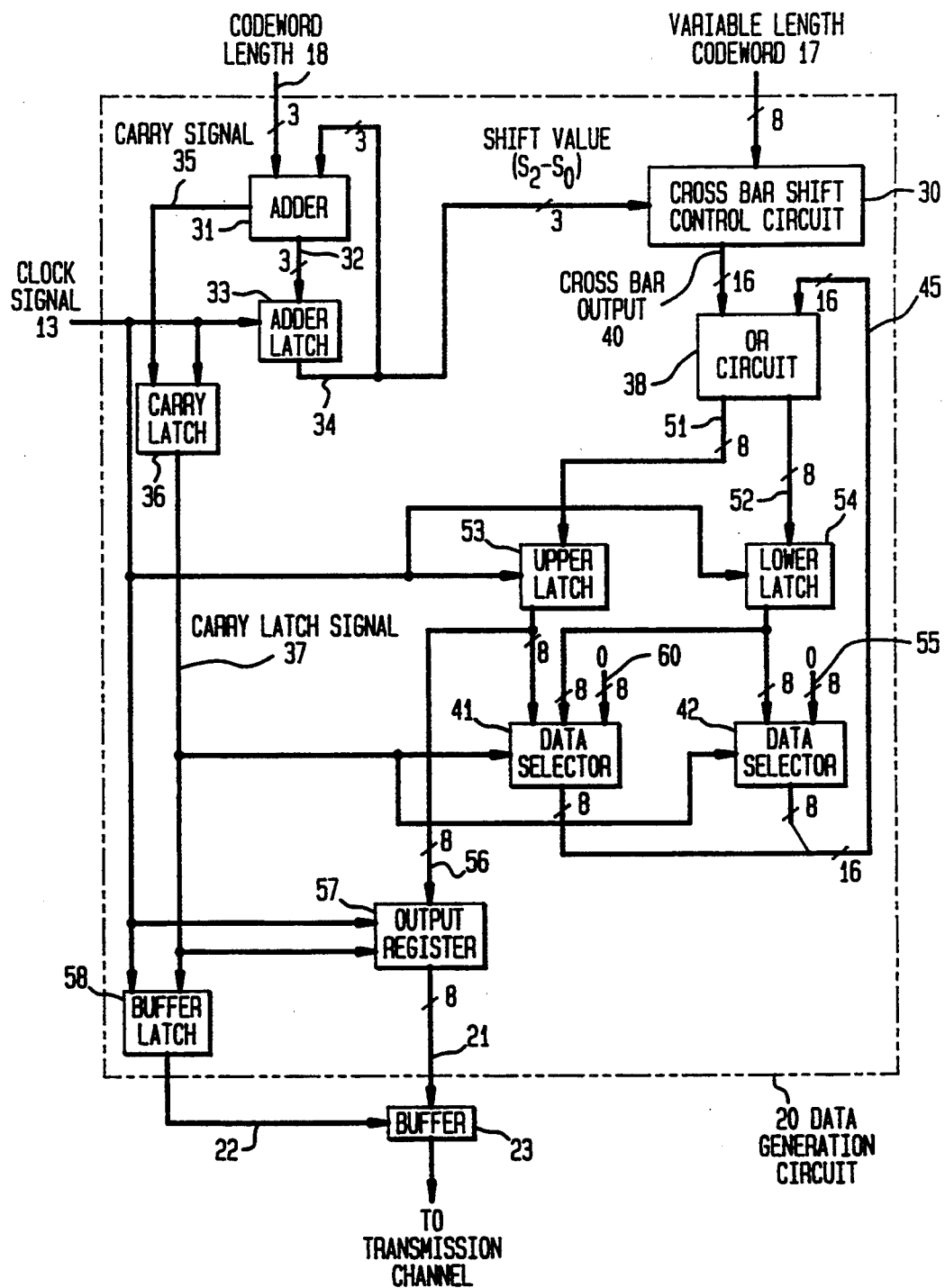
FIG. 2 is a block diagram of the data generation circuit and the buffer of the encoder in FIG. 1, which concatenates the successive variable-length codewords and produces fixed-length output segments as input to the buffer as that fixed number of bits are accumulated.

Operation of the data generation circuit 20 in FIG. 2 is more readily understood with reference to the example shown in the table formed by the combination of FIGS. 5A and 5B, placed side-by-side, as shown in FIG. 5C. The left hand "clock" entry in FIG. 5A has been duplicated in FIG. 5B for ease of reading. FIGS. 5A and 5B will hereinafter be referred to as FIG. 5, singularly. FIG. 5 will be described in conjunction with FIG. 2.

Adder latch 33 and carry latch 36 are initially set with 0 as indicated in FIG. 5 with a box surrounding the numeral. The upper latch 53 and the lower latch 54 are also initially set with all 0s in each bit position, as indicated with boxes. The initial variable-length codeword on leads 17 is $a_1a_2a_300000$ and the corresponding codeword length, on leads 18, is equivalent to a length of 3. At the first clock tick output register 57 contains noise, indicated by an X in the table. The output of adder 31 is 3, and carry is 0. The output 40 of cross bar shift control circuit 30 is determined by the input variable-length codeword, as shifted by the shift value of adder latch 33, which is initially set at 0. The 16-bit cross bar output is thus $a_1a_2a_30000000000000$. The outputs of data selectors 41 and 42 are determined by the initial sequences in upper and lower latches 53 and 54 and are therefore each 00000000. The 16-bit output of OR circuit 38 is the combination of the output of cross bar shift control circuit 30 and the outputs of data selectors 41 and 42, and is therefore equal to $a_1a_2a_30000000000000$.

At the second clock tick the next variable-length codeword, on leads 34, is $b_1b_2b_3b_40000$, with a codeword length of 4 on leads 18. The previous adder output, 3, is entered into adder latch 33, and carry latch remains 0. The eight most significant bits of the previous OR circuit output 51 are entered in upper latch 53, and the eight least significant bits of the previous OR circuit output 52 are entered in lower latch 54, or $a_1a_2a_300000$ and 00000000, respectively. The output register 57 still contains noise. Adder 31 sums the current codeword length of 4 with the 3 in adder latch 33, to produce 7 on leads 32. Carry remains 0. With the shift value output of adder latch 33 being 3, cross bar shift control circuit 30 shifts its input by three bits to produce an output of $000b_1b_2b_3b_4000000000$. Data selector 41 selects the sequence in upper latch 53 for its output, or $a_1a_2a_300000$, and data selector 42 selects the sequence in lower latch 54 for its output, or 00000000. The 16-bit output of OR circuit 38 is the sum of the combined data selector outputs and the cross bar shift control circuit output 40, or $a_1a_2a_3b_1b_2b_3b_4000000000$. As can be noted, the OR circuit 38 has concatenated the second variable-length codeword to the significant non-filler bits of the first variable-length codeword.

At the third clock tick the variable-length input codeword on leads 17 is $c_1c_2c_3c_4c_5c_600$, with a corresponding codeword length of 6 on leads 18. Adder latch 33, and thus the shift value, is the previous output of adder 31, or 7. Carry latch still remains 0. The eight upper bits of the previous OR circuit output 51, $a_1a_2a_3b_1b_2b_3b_40$, are entered in upper latch 53, and the eight lower bits, 00000000, are entered in lower latch 54. Output register 57 still contains noise. The output of adder 31 is the modulo-8 sum of the current codeword length, 6, plus the adder latch 33 output of 7, for a total of 5 with a carry of 1. Cross bar shift control circuit 30 shifts the input word by the shift value of 7 to produce an output of $0000000c_1c_2c_3c_4c_5c_600$. Data selector 41 selects the sequence in upper latch 53 and data selector 42 selects the sequence in lower latch 54. The OR circuit 38 combines the outputs of data selectors 41 and 42 with the output of cross bar shift control circuit 40 to produce an output of $a_1a_2a_3b_1b_2b_3b_4c_1c_2c_3c_4c_5c_600$.

At the forth clock tick the input word is $d_1d_2d_300000$, having a codeword length of 3. The adder latch 33, and thus the shift value, is the previous output of adder 31, equal to 5. Since the carry was 1 at the previous clock tick, carry latch 36 is 1 at this clock tick. Upper latch 53 receives the upper 8-bits of the previous OR circuit 38 output, or $a_1a_2a_3b_1b_23b_4c_1$, and lower latch 54 receives the lower 8-bits of the OR output, or $c_2c_3c_4c_5c_6000$. The output register 57 still contains noise and the output of adder 31 is the sum of the current codeword length, 3, with the contents of adder latch 33, 5, for a total of 0 with a carry of 1. The cross bar circuit 30 output is shifted by the shift value of 5 to produce an output of $00000d_1d_2d_300000000$. Since the carry latch is now 1, however, data selector 41 selects the contents of lower latch 54 for its output, $c_2c_3c_4c_5c_6000$, and data selector 42 selects all 0s from inputs 55. The OR circuit 38 output is thus $c_2c_3c_4c_5c_6d_1d_2d_300000000$.

At the fifth clock tick the input variable-length codeword is $e_1e_2e_3e_40000$, having a length of 4. The adder latch 33 output, and thus the shift value, is the previous output of adder 31 output, or 0. Since the previous carry was 1, carry latch 36 remains at 1. The upper latch 53 is the upper 8-bits of the previous OR circuit 38 output, or $c_2c_3c_4c_5c_6d_1d_2d_3$, and the lower latch 54 is the lower 8-bits of the OR output, or 00000000. Since the previous carry latch was 1, output register 57 receives the previous upper latch value of $a_1a_2a_3b_1b_2b_4c_1$. The output of adder 31 is now 4 with a carry of 0. With a shift of 0, the cross bar control circuit output is $e_1e_2e_3e_4000000000000$. Since carry latch is 1, data selector 41 selects the lower latch for its output of 00000000, and data selector 42 selects all "0"s from leads 55 for its outputs. The OR circuit 38 output is thus equal to the output of cross bar shift control circuit 30, $e_1e_2e_3e_4000000000000$.

At the sixth clock tick, the previous carry latch was 1 so that the output register 57 receives the segment in the upper latch at the fifth clock tick, or $c_2c_3c_4c_5c_6d_1d_2d_3$.

At the seventh clock tick, the previous carry latch is 0 so that output register 57 retains its previous value, indicated in FIG. 5 with a "—" in the "output register" column. Similarly, at the eighth clock tick, the previous carry latch is still 0 and output register 57 remains unchanged. At the ninth clock tick, however, the previous clock tick is 1 and the next sequential 8-bit segment, $e_1e_2e_3e_4f_1f_2g_1g_2$, is entered into output register 57.

From the above-described example, it is evident how the sequential variable-length codewords are concatenated and how, each time 8-bits are accumulated, an 8-bit segment is outputted for storage in the buffer 23.

In the embodiment of the present invention described hereinabove, each output segment is equal in length to the maximum variable-length codeword length, which in the described embodiment is 8-bits. In an actual circuit, however, the maximum length codeword can be generalized to be N-bits, and the length of each output segment can be M-bits, where $M \geq N$. In this general case the adder 31 and adder latch 33 count codeword lengths modulo-M. The cross bar shift control circuit 30 has an N-bit input and an (M+N)-bit output. Upper latch 53 stores M-bits and lower latch 54 stores N-bits. When the carry latch signal 37 is "1" and data selector 41 selects the contents of lower latch 54 to output, an additional (M−N) "0"-bits are inserted following the N-bits from lower latch 54 so that a total of M-bits are output by that data selector. This is shown in FIG. 2 with dotted input leads 60 of "0" inputs to data selector 41.

The above-described embodiment is illustrative of the principles of the present invention. Other embodiments could be devised by those skilled in the art without departing from the spirit and scope of the present invention.

What is claimed is:

1. An apparatus for encoding data words of variable bit length supplied at a first data rate into data words of constant bit length supplied at a second data rate, comprising:

first register means for receiving a data word of variable bit length of up to m bits at said first data rate;

shifter means for bit shifting said data word of variable bit length from said first register means in accordance with a control signal, thereby forming a first shifted data word and a second shifted data word;

control signal generating means for generating said control signal in accordance with a number of bits of previously shifted data words awaiting output;

concatenating means for concatenating said first shifted data word and said bits of previously shifted data words awaiting output, thereby forming a concatenated data word;

second register means for storing said concatenated data word, said concatenated data word being said bits of previously shifted data awaiting output with respect to a next data word of variable bit length when said concatenated data word has less than n bits;

third register means for storing said second shifted data word, said second shifted data word being said bits of previously shifted data awaiting output with respect to a next data word of variable bit length when said concatenated data word has n bits;

zero value data generating means for generating zero value data for clearing said third register means when said second shifted data word is concatenated with a next first shifted data word;

buffering means for receiving said concatenated data word from said second register means when said concatenated data word has n bits and for storing said concatenated data word as one of a plurality of data words of constant bit length; and output means for outputting said data words of constant bit length from said buffering means at said second data rate.

* * * * *